(12) United States Patent
Chen et al.

(10) Patent No.: US 12,532,775 B2
(45) Date of Patent: Jan. 20, 2026

(54) METHODS AND ASSEMBLIES FOR MEASUREMENT AND PREDICTION OF PACKAGE AND DIE STRENGTH

(71) Applicant: Micron Technology, Inc., Boise, ID (US)

(72) Inventors: Chien Ming Chen, Taichung (TW); Shams U. Arifeen, Boise, ID (US); Chong Leong Gan, Taichung (TW); Christopher Glancey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 589 days.

(21) Appl. No.: 17/675,994

(22) Filed: Feb. 18, 2022

(65) Prior Publication Data

US 2023/0268318 A1    Aug. 24, 2023

(51) Int. Cl.
*H01L 23/31* (2006.01)
*H01L 21/56* (2006.01)
(Continued)

(52) U.S. Cl.
CPC .......... *H01L 25/0657* (2013.01); *H01L 21/56* (2013.01); *H01L 23/3128* (2013.01);
(Continued)

(58) Field of Classification Search
CPC ............... H01L 23/147; H01L 23/3128; H01L 23/49816; H01L 23/5386; H01L 23/562;
(Continued)

(56) References Cited

U.S. PATENT DOCUMENTS 6,836,020 B2 * 12/2004 Cheng ............... H01L 21/76898
257/774
8,842,945 B2 * 9/2014 Nguyen .............. H01L 27/1203
385/9

(Continued)

FOREIGN PATENT DOCUMENTS

EP          3623786 A1 *  3/2020    ............. C09D 11/52
JP       2017101983 A  *  6/2017
WO    WO-2017094368 A1 *  6/2017

*Primary Examiner* — Ajay Ojha
*Assistant Examiner* — Tsz K Chiu
(74) *Attorney, Agent, or Firm* — Dorsey & Whitney LLP

(57) ABSTRACT

Systems and methods for measuring and predicting the strength of semiconductor devices and packaging are disclosed. In some embodiments, a semiconductor device assembly comprises a package substrate, a semiconductor die electrically coupled to the package substrate, and a molding covering at least a portion of the semiconductor die, where the molding includes a through-mold via (TMV) extending from an upper surface into the mold material to a depth. The semiconductor device assembly can include a strain gauge disposed in the molding at the depth of the TMV and be electrically coupled to the TMV. For example, the TMV can extend to the surface of the semiconductor die, to the package substrate, or other critical areas of the semiconductor device assembly, enabling strain to be measured at these depths. The semiconductor device assembly can be used in testing to predict the strength of the die and packaging in real-world scenarios, such as being dropped, bent, or crushed.

9 Claims, 11 Drawing Sheets

(51) Int. Cl.
  *H01L 23/48* (2006.01)
  *H01L 25/00* (2006.01)
  *H01L 25/065* (2023.01)

(52) U.S. Cl.
  CPC ............ *H01L 23/481* (2013.01); *H01L 25/50* (2013.01); *H01L 2225/06506* (2013.01); *H01L 2225/0651* (2013.01); *H01L 2225/06548* (2013.01); *H01L 2225/06562* (2013.01)

(58) Field of Classification Search
  CPC ......... H01L 23/16; H01L 23/24; H01L 24/16; H01L 24/48; H01L 24/32; H01L 24/33; H01L 24/73; H01L 24/81; H01L 24/46; H01L 25/18; H01L 25/0657; H01L 25/50; H01L 2224/32145; H01L 2224/48145; H01L 2224/48227; H01L 2224/73215; H01L 2224/73265; H01L 2225/06506; H01L 2225/0651; H01L 2224/48237; H01L 2224/73253; H01L 25/0652; H01L 21/56; H01L 2225/06548; H01L 2225/06562; H01L 23/481
  See application file for complete search history.

(56) References Cited

U.S. PATENT DOCUMENTS

| | | | | |
|---|---|---|---|---|
| 10,217,045 | B2* | 2/2019 | Lal | G06V 40/1306 |
| 11,656,272 | B1* | 5/2023 | Jones | G01R 31/2891 |
| | | | | 324/762.01 |
| 2005/0143640 | A1* | 6/2005 | Hoctor | A61B 8/4236 |
| | | | | 600/407 |
| 2007/0096616 | A1* | 5/2007 | Han | H01L 21/76879 |
| | | | | 257/E21.586 |
| 2009/0148967 | A1* | 6/2009 | Wodnicki | H01L 22/14 |
| | | | | 257/E21.521 |
| 2010/0236334 | A1* | 9/2010 | Koschmieder | G01N 19/08 |
| | | | | 73/799 |
| 2010/0265751 | A1* | 10/2010 | Hong | G11C 5/06 |
| | | | | 257/E23.141 |
| 2012/0126959 | A1* | 5/2012 | Zarrabi | B06B 1/0688 |
| | | | | 340/407.1 |
| 2012/0193734 | A1* | 8/2012 | Farahani | G01L 1/2293 |
| | | | | 977/842 |
| 2013/0082260 | A1* | 4/2013 | Nakamura | H01L 22/14 |
| | | | | 438/18 |
| 2013/0164867 | A1* | 6/2013 | Ramasamy | H01L 24/19 |
| | | | | 257/E33.059 |
| 2013/0221455 | A1* | 8/2013 | Manack | B81B 7/0067 |
| | | | | 257/431 |
| 2014/0355381 | A1* | 12/2014 | Lal | H01J 49/025 |
| | | | | 327/356 |
| 2015/0179616 | A1* | 6/2015 | Lin | H01L 23/3121 |
| | | | | 257/773 |
| 2015/0282304 | A1* | 10/2015 | Ely | H05K 1/0281 |
| | | | | 174/254 |
| 2015/0296607 | A1* | 10/2015 | Yang | H05K 1/167 |
| | | | | 361/749 |
| 2015/0380377 | A1* | 12/2015 | Uzoh | H01L 24/49 |
| | | | | 257/773 |
| 2016/0043043 | A1* | 2/2016 | Karpman | H01L 23/576 |
| | | | | 73/777 |
| 2016/0071818 | A1* | 3/2016 | Wang | H01L 24/49 |
| | | | | 257/773 |
| 2016/0276307 | A1* | 9/2016 | Lin | H01L 23/562 |
| 2017/0250172 | A1* | 8/2017 | Huang | H01L 24/14 |
| 2019/0055377 | A1* | 2/2019 | Tsutsumi | C08G 59/245 |

* cited by examiner

METHODS AND ASSEMBLIES FOR MEASUREMENT AND PREDICTION OF PACKAGE AND DIE STRENGTH

TECHNICAL FIELD

The present disclosure generally relates to semiconductor device assemblies and methods, particularly relating to measurement and prediction of package and die strength.

BACKGROUND

Semiconductor device manufacturers continually seek to make smaller, faster, and more powerful devices with a higher density of components for a wide variety of products, such as computers, cell phones, watches, cameras, and more. This increased power and speed, along with the decreased footprint, have increased portability while allowing consumers to use these products for an increasing number of applications. As a result, these products are subjected to a variety of hazardous scenarios in day-to-day use, such as being dropped or crushed, which may damage the semiconductor components inside. Accordingly, manufacturers of semiconductor devices and of the products using the semiconductor devices would both benefit from improved approaches to measure and predict the strength of semiconductor devices and packaging.

BRIEF DESCRIPTION OF THE DRAWINGS

Many aspects of the present technology can be better understood with reference to the following drawings. The components in the drawings are not necessarily to scale. Instead, emphasis is placed on clearly illustrating the principles of the present technology.

DETAILED DESCRIPTION

Figure 1A:
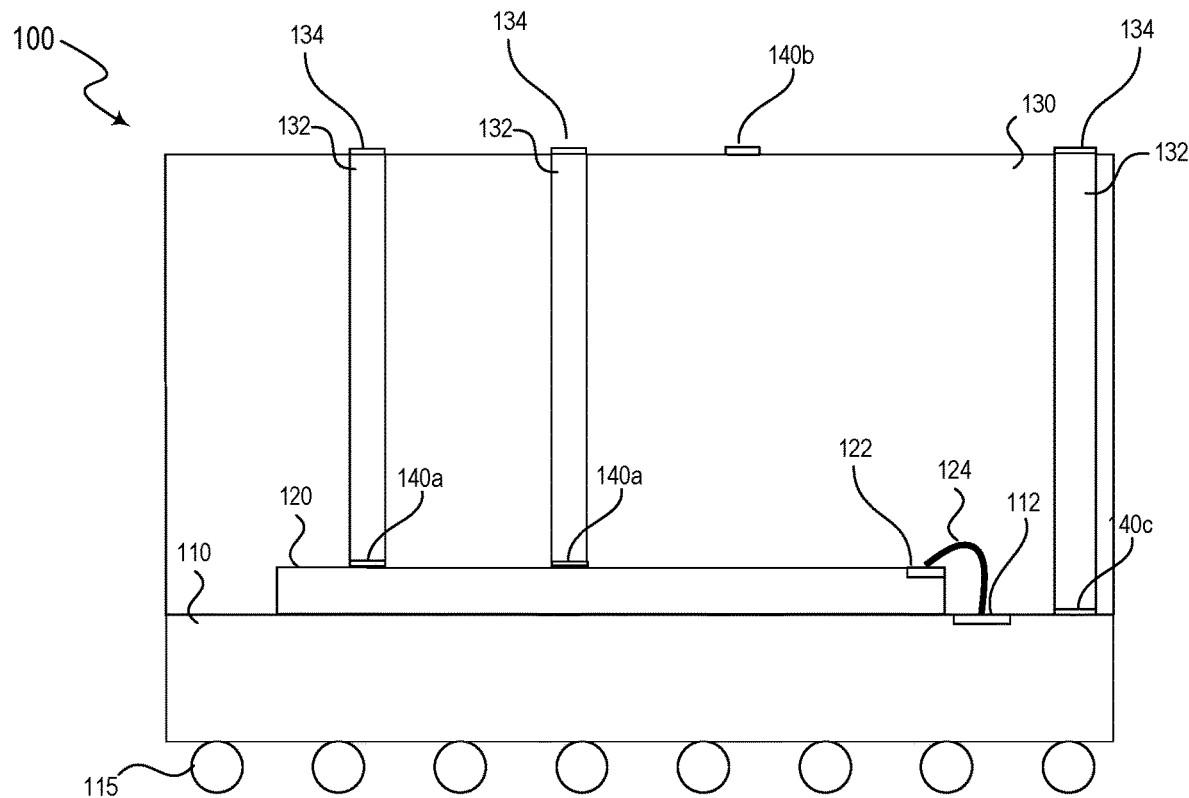
FIG. 1A is a cross-sectional view of a semiconductor device assembly in accordance with an embodiment of the present disclosure.

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate. A semiconductor device may refer herein to a semiconductor die, but semiconductor devices are not limited to semiconductor dies.

Semiconductor device assemblies are frequently integrated into electronic devices, such as cellular telephones, portable computers, computing tablets, etc., that can occasionally be subjected to potentially destructive forces associated with dropping the device. Accordingly, semiconductor device assemblies are designed and manufactured to be resistant to expected levels of such forces, and tested to ensure their survivability when such forces are applied. To facilitate such design, manufacture, and testing, embodiments of the present disclosure provide semiconductor device assemblies with one or more in situ strain gauges, not only at external surfaces of the assemblies, but also disposed within the assemblies at various depths, and provides electrical connectivity to the strain gauges by way of through-mold vias.

In some embodiments, a semiconductor device assembly can comprise a package substrate, a semiconductor die electrically coupled to the substrate, and a molding covering at least a portion of the semiconductor die. The semiconductor device assembly can include a through mold via (TMV) extending from an outer surface into the molding at a depth. The semiconductor device assembly can further comprise a strain gauge disposed in the molding at the depth of the TMV. This enables the strain gauge to measure strain at various depths of the semiconductor device assembly. For example, the TMV can extend to a surface of the semiconductor die to measure strain experienced at the die. In another example, the TMV can extend to a surface of the package substrate to measure strain at the substrate level. In yet another example, a strain gauge can be positioned at any intermediate depth of the package, or even at the outer surface of the molding, to measure strain at any desired depth.

The semiconductor device assembly can include a plurality of TMVs and a plurality of strain gauges, thereby allowing for simultaneous strain measurements at multiple positions within the semiconductor device assembly. For example, the semiconductor device assembly can include a first TMV extending from an outer surface of the molding to a surface of the semiconductor die and a second TMV extending from the outer surface of the molding to a surface of the package substrate. In another example, the semiconductor device assembly can include multiple TMVs extending to the same surface of the semiconductor die to measure strain at different positions of the die.

In some embodiments, the semiconductor device assembly can include a stack of semiconductor dies. The stack of semiconductor dies can be arranged such that at least some of the semiconductor dies are partially stacked above other semiconductor dies in the stack, such as in a fan-out arrangement. The semiconductor device assembly can include multiple TMVs that extend to the surfaces of different semiconductor dies of the stack, with strain gauges embedded accordingly. This enables strain to be measured at multiple semiconductor dies in the stack.

FIG. 1A is a cross-sectional view of a semiconductor device assembly 100 in accordance with an embodiment of the present disclosure. The semiconductor device assembly 100 can include a package substrate 110 coupled to conductive structures 115 (e.g., BGA, solder balls, pins, or pads without attached mounting elements). The package substrate 110 can carry a semiconductor die 120. The package substrate 110 can further include a substrate pad 112 coupled to a bond pad 122 of the semiconductor die 120 through bond wires 124. In this manner, the semiconductor die 120 can transmit and/or receive signals through the bond wires 124. The package substrate 110 can include additional conductive components, such as vias, traces, pads, etc. (not shown) coupling the substrate pads 112 to the conductive structures 115.

The semiconductor device assembly 100 can include a molding 130. The molding 130 can encapsulate or cover at least a portion of the semiconductor die 120. The molding 130 can be made of any suitable material used in semiconductor packaging, such as epoxy resins. The molding 130 can be formed by processes such as injection or transfer molding.

The semiconductor device assembly 100 can include one or more through mold vias (TMVs) 132. The TMVs 132 can electrically couple elements outside the molding 130 to elements within or underneath the molding 130. The TMVs 132 can extend from an outer surface of the molding 130 at a desired depth. For example, the TMVs 132 can extend to a surface of semiconductor die 120 or to the package substrate 110. The TMVs 132 can also extend to other components beneath the molding 130, or to an intermediate depth of the molding 130. The TMVs 132 can be formed in an opening of the molding 130 by plating the opening with a conductive material. In some embodiments, the TMVs 132 can be prefabricated according to (e.g., having a shape and size equal to or smaller than) the shape and/or size of an opening, then disposed in the opening. The openings can be formed in the molding 130 by etching, drilling, or other suitable processes.

The semiconductor device assembly 100 shown in FIG. 1A has three TMVs 132. In this example, two of the TMVs 132 extend from the outer surface of the molding 130 to a surface of the semiconductor die 120, and one TMV 132 extends to a surface of the substrate 110. In some embodiments, different numbers of TMVs 132 can be formed in the molding 130, such as one, two, four, or more, each at various depths in the molding 130.

The semiconductor device assembly 100 can include one or more strain gauges, such as strain gauges 140a, 140b, and 140c (collectively, strain gauges 140) shown in FIG. 1A. Strain gauges 140 can be embedded at various depths in the molding 130. For example, FIG. 1A shows two strain gauges 140a at the surface of the semiconductor die 120, a strain gauge 140b at the outer surface of the molding 130, and a strain gauge 140c at the surface of the package substrate 110. Placing strain gauges at these positions enables the strain to be measured at critical interfaces of the semiconductor device assembly 100, which is important when assessing the effects of possible stress to the semiconductor die 120 and to the semiconductor device assembly 100 as a whole. For example, the semiconductor device assembly 100 can be used to inform the design and testing of packaging for semiconductor devices, such as semiconductor die 120. In another example, the semiconductor device assembly 100 can be used to predict and test the strength of a semiconductor device to be used in electronics products. In addition, the two strain gauges 140a allow strain to be measured at different positions of the semiconductor device. Note that the strain gauges 140 can have other positions and depths by varying their depth and locations in the molding 130, such as at surfaces of other components beneath the molding 130, or at an intermediate depth remote from the surface of any component. For example, it may be desired to measure strain at multiple positions on the outer surface of the molding 130, or to measure strain at multiple positions of the packaging substrate 110 using two strain gauges 140.

The strain gauges 140 can change resistance when a force is applied. Thus, a current measured across the strain gauge 140 can be correlated to the applied force. The current across a strain gauge 140 positioned on an outer surface of the molding, such as strain gauge 140c, can be directly measured by a suitable measurement device. A strain gauge 140 within the molding 130, such as strain gauges 140a and 140c, can be electrically coupled to one or more of the TMVs 132, and/or to one or more of the conductive structures 115. The semiconductor device assembly 100 can include bond pads 134 at the outer surface of the molding which are electrically coupled to the TMVs 132. Thus, a circuit incorporating the strain gauge 140a or 140c can run from the bond pad 134 at the outer surface of the molding 130, through the TMV 132 to the strain gauge 140a or 140c, and out through a conductive structure 115, such as a solder ball of a BGA, or back through a second TMV 132. For example, the strain gauges 140a at the surface of the semiconductor die 120 can be electrically coupled to the semiconductor die 120, which can be electrically coupled to the package substrate 110 through bond pads 122, bond wires 124, and substrate pads 112. The package substrate 110 can include internal connections to conductive structures 115, which can then be used to measure current across strain gauges 140a. Similarly, strain gauge 140c positioned at the surface of the package substrate 110 can be electrically coupled to the package substrate 110, and the strain can thus be measured using corresponding conductive structures 115. In some embodiments, the strain can be measured across two conductive structures 115 instead of one conductive structure 115 and one bond pad 134. In some embodiments, the strain can be measured across two bond pads 134, each coupled to a TMV 132, as shown in FIG. 1B.

The strain gauges 140 can be fabricated by printing, photolithography, etching, or various other methods. In some embodiments, the strain gauges 140 can be fabricated and then positioned in the semiconductor device assembly 100, such as on the outer surface of the molding 130 or within the molding 130 through an opening. In some embodiments, the strain gauges 140 can be printed directly into place by an inkjet printing nozzle. The strain gauges 140 can be comprised of copper or other conducting material, such as iron or aluminum, and measure approximately 0.2 mm to 4.0 mm in size. The strain gauges 140 can be uniaxial or triaxial, as discussed with reference to FIG. 6A-C.

The semiconductor device assembly 100 can include a filler material, such as epoxy molding compound. The filler material can fill space in an opening of the molding 130, such as an opening containing a TMV 132. The filler material can fill space adjacent to the strain gauges 140 and can have a smaller average particle size, such as less than about 5 µm. Using a smaller filler material can result in more accurate measurements of the strain gauges 140, as larger particles can artificially restrict movement of the surfaces below strain gauges.

Figure 1B:
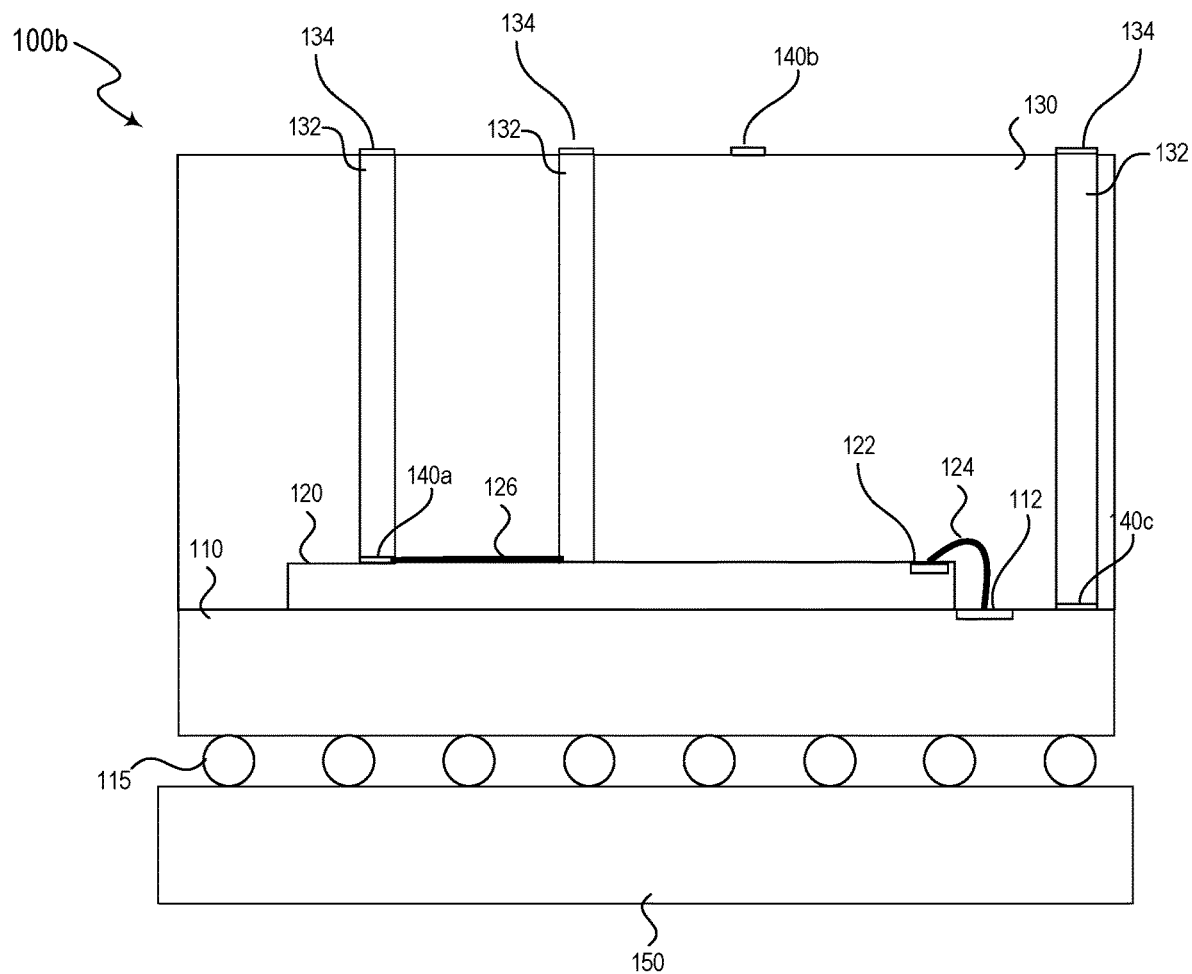
FIG. 1B is a cross-sectional view of a semiconductor device assembly including a strain gauge electrically coupled to two through mold vias (TMVs) in accordance with an embodiment of the present disclosure.

FIG. 1B is a cross-sectional view of a semiconductor device assembly 100b including a strain gauge electrically coupled to two through mold vias (TMVs) 132 in accordance with an embodiment of the present disclosure. As shown, the semiconductor device assembly 100b can mounted to a PCB 150 (e.g., a test device, a system in which the assembly 100b is incorporated, etc.) through conductive structures 115. As discussed above, the strain gauges 140 can vary in resistance in response to strain. Because the strain gauge 140a is electrically coupled to two TMVs 132, the resistance can be measured using two bond pads 134, such as by applying a probe to each bond pad 134. In contrast, for example, strain gauge 140c as shown in FIG. 1B is electrically coupled to a single TMV 132, and resistance across the strain gauge 140c can be measured using one bond pad 134 and one conductive structure 115. The strain gauge 140a is shown coupled to a TMV via a trace 126, though any suitable electrical connection can be used. In some embodiments, strain gauges at any position in the molding 130 can be electrically coupled to two TMVs, not only the strain gauge 140a at the surface of the semiconductor die 120.

Figure 2:
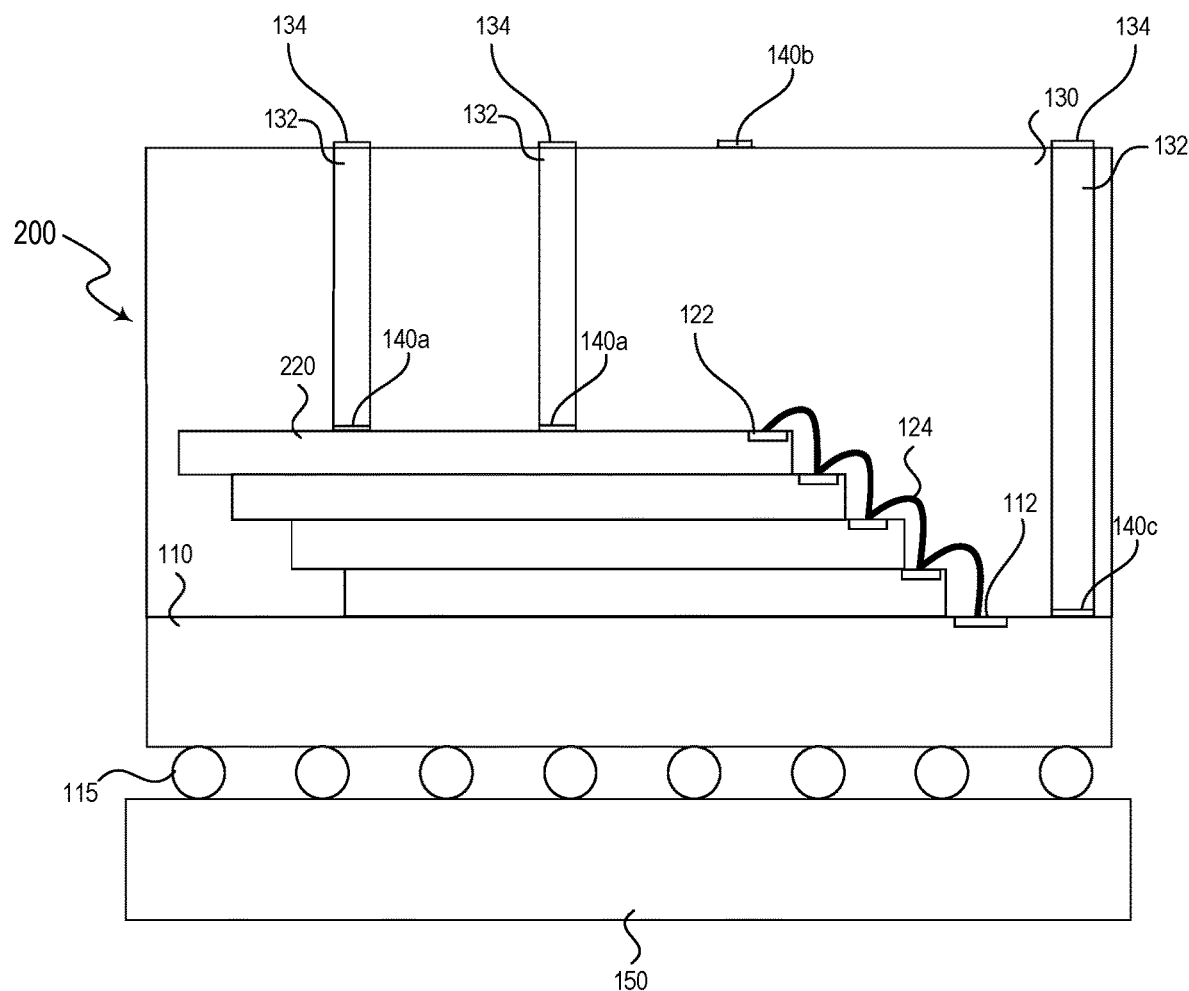
FIG. 2 is a cross-sectional view of a semiconductor device assembly with a stack of semiconductor dies in accordance with an embodiment of the present disclosure.

FIG. 2 is a cross-sectional view of a semiconductor device assembly 200 with a stack of semiconductor dies 220 in accordance with an embodiment of the present disclosure. The semiconductor device assembly 200 can be similar to semiconductor device assembly 100 of FIG. 1A, except it includes a stack of semiconductor dies 220 instead of a semiconductor die 120. The stack of semiconductor dies 220 can include any suitable number of semiconductor dies and can be stacked vertically, in a fan-out stack, or other stacking arrangements. The stack 220 can include semiconductor dies of varying sizes or dies of the same size. The semiconductor die stack 220 shown in FIG. 2 can be electrically coupled via a plurality of bond wires 124 and bond pads 122, but other structures, such as through silicon vias (TSVs) can be used to electrically couple the dies of the stack 220.

The semiconductor device assembly 200 can include one or more strain gauges, such as strain gauges 140a, 140b, and 140c (collectively, strain gauges 140). The strain gauges 140 can be similar to the strain gauges 140 of FIGS. 1A-B. Strain gauges 140 can be embedded at various depths in the molding 130. For example, FIG. 2 shows two strain gauges 140a at the surface of the semiconductor die stack 220, a strain gauge 140b at the outer surface of the molding 130, and a strain gauge 140c at the surface of the package substrate 110. Note that the strain gauges 140 can have other positions and depths by varying their depths and locations in the molding 130, such as at surfaces of other components beneath the molding 130, or at an intermediate depth remote from the surface of any component. For example, it may be desired to measure strain at multiple positions on the outer surface of the molding 130, or to measure strain at multiple positions of the packaging substrate 110 using two strain gauges 140.

The strain gauges 140 can change resistance when a force is applied. Thus, a current measured across the strain gauge 140 can be correlated to the applied force. The current across a strain gauge 140 positioned on an outer surface of the molding, such as strain gauge 140c, can be directly measured by a suitable measurement device. A strain gauge 140 within the molding 130, such as strain gauges 140a and 140c, can be electrically coupled to one or more of the TMVs 132, and/or to one or more of the conductive structures 115. The semiconductor device assembly 100 can include bond pads 134 at the outer surface of the molding which are electrically coupled to the TMVs 132. Thus, a circuit incorporating the strain gauge 140a or 140c can run from the bond pad 134 at the outer surface of the molding 130, through the TMV 132 to the strain gauge 140a or 140c, and out through a conductive structure 115, such as a solder ball of a BGA, or back through a second TMV 132. For example, the strain gauges 140a at the surface of the semiconductor die stack 220 can be electrically coupled to the semiconductor die stack 220, which can be electrically coupled to the package substrate 110 through bond pads 122, bond wires 124, and substrate pads 112. The package substrate 110 can include internal connections to conductive structures 115, which can then be used to measure current across strain gauges 140a. Similarly, strain gauge 140c positioned at the surface of the package substrate 110 can be electrically coupled to the package substrate 110, and the strain can thus be measured using corresponding conductive structures 115. In some embodiments, the strain can be measured across two conductive structures 115 instead of one conductive structure 115 and one bond pad 134. In some embodiments, the strain can be measured across two bond pads 134, each coupled to a TMV 132.

The strain gauges 140 can be fabricated by printing, photolithography, etching, or various other methods. In some embodiments, the strain gauges 140 can be fabricated and then positioned in the semiconductor device assembly 200, such as on the outer surface of the molding 130 or within the molding 130 through an opening. In some embodiments, the strain gauges 140 can be printed directly into place by an inkjet printing nozzle. The strain gauges 140 can be comprised of copper or other conducting material, such as iron or aluminum, and measure approximately 0.2 mm to 4.0 mm in size. The strain gauges 140 can be uniaxial or triaxial.

Figure 3:
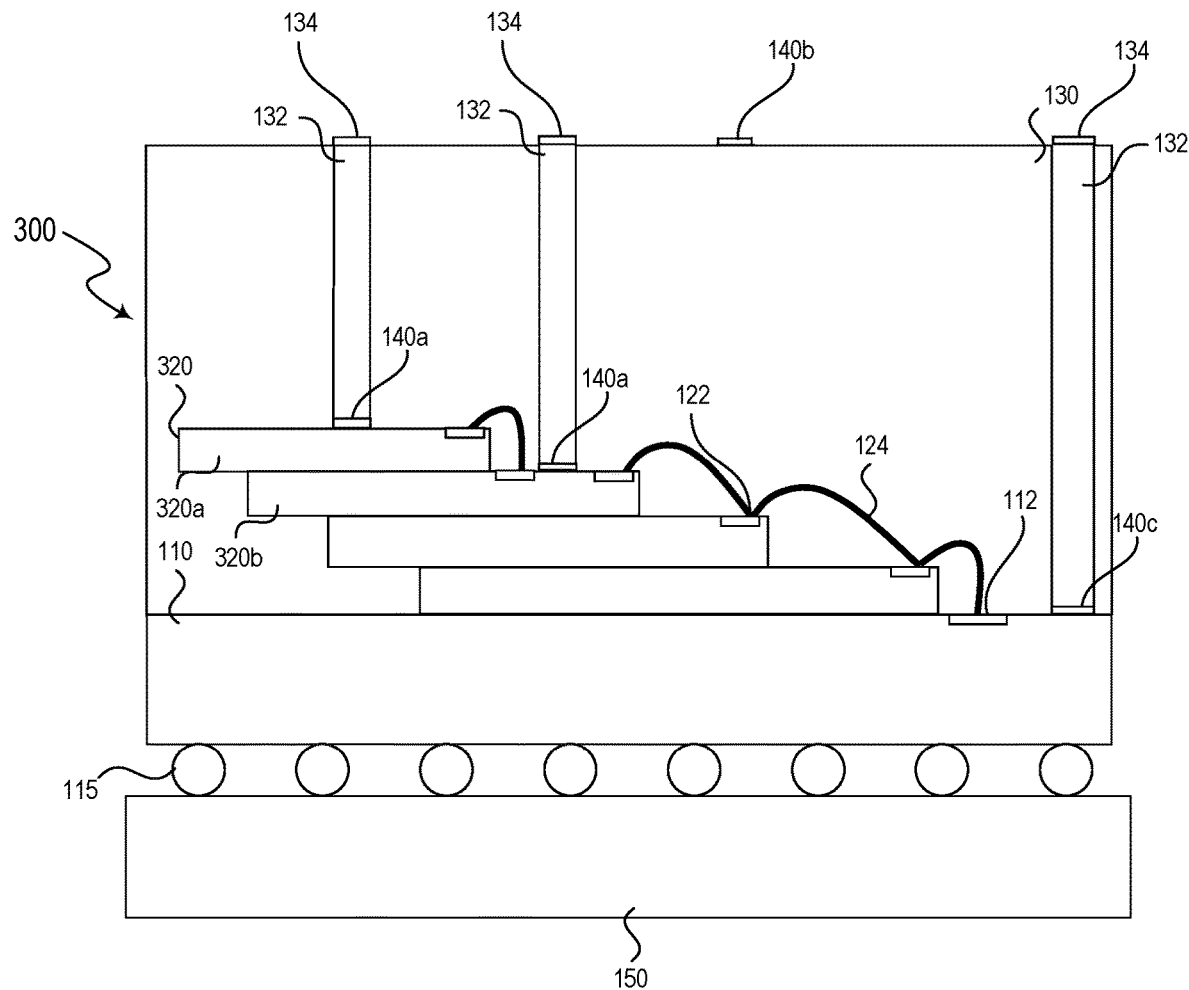
FIG. 3 is a cross-sectional view of a semiconductor device assembly with a stack of semiconductor dies in accordance with an embodiment of the present disclosure.

FIG. 3 is a cross-sectional view of a semiconductor device assembly 300 with a stack of semiconductor dies 320 in accordance with an embodiment of the present disclosure. The semiconductor device assembly 300 can be similar to semiconductor device assembly 100 of FIG. 1A and semiconductor device assembly 200 of FIG. 2. Semiconductor die stack 320 can be similar to semiconductor die stack 220 shown in FIG. 2. The stack of semiconductor dies 320 can be arranged so that a first semiconductor die 320a partially overlaps with a second semiconductor die 320b. Accordingly, one TMV 132 extends from the outer surface of the molding 130 to a surface of the first semiconductor die 320a, and another TMV 132 extends from the outer surface of the molding 130 to a surface of the second semiconductor die 320b. The stack 320 can include semiconductor dies of varying sizes or dies of the same size. The semiconductor die stack 320 shown in FIG. 3 is electrically coupled via a plurality of bond wires 124 and bond pads 122, but other structures, such as through silicon vias (TSVs) can be used to electrically couple the dies of the stack 320. Also depicted is a third TMV 132 extending from the outer surface of the molding 130 to a surface of the package substrate 110, similar to TMV 132 of FIGS. 1A, 1B and 2.

The semiconductor device assembly 300 can include one or more strain gauges, such as strain gauges 140a, 140b, and 140c (collectively, strain gauges 140). The strain gauges 140 can be similar to the strain gauges 140 of FIGS. 1-2. Strain gauges 140 can be embedded at various depths in the molding 130. For example, FIG. 3 shows two strain gauges 140a at surfaces of the semiconductor die stack 320—one on the first semiconductor die 320a and one on the second semiconductor die 320b. Also shown are a strain gauge 140b at the outer surface of the molding 130, and a strain gauge 140c at the surface of the package substrate 110. Note that the strain gauges 140 can have other positions and depths by varying their depths and locations in the molding 130, such as at surfaces of other components beneath the molding 130, or at an intermediate depth remote from the surface of any component. For example, it may be desired to measure strain at multiple positions on the outer surface of the molding 130, or to measure strain at multiple positions of the packaging substrate 110 using two strain gauges 140.

The strain gauges 140 can change resistance when a force is applied. Thus, a current measured across the strain gauge 140 can be correlated to the applied force. The current across a strain gauge 140 positioned on an outer surface of the molding, such as strain gauge 140c, can be directly measured by a suitable measurement device. A strain gauge 140 within the molding 130, such as strain gauges 140a and 140c, can be electrically coupled to one or more of the TMVs 132, and/or to one or more of the conductive structures 115. The semiconductor device assembly 100 can include bond pads 134 at the outer surface of the molding which are electrically coupled to the TMVs 132. Thus, a circuit incorporating the strain gauge 140a or 140c can run from the bond pad 134 at the outer surface of the molding 130, through the TMV 132 to the strain gauge 140a or 140c, and out through a conductive structure 115, such as a solder ball of a BGA, or back through a second TMV (not shown). For example, the strain gauges 140a at the surface of the semiconductor die 320a can be electrically coupled to the semiconductor die 320a, which can be electrically coupled to the package substrate 110 through bond pads 122, bond wires 124, and substrate pads 112. The package substrate 110 can include internal connections to conductive structures 115, which can then be used to measure current across strain gauges 140a. Similarly, strain gauge 140c positioned at the surface of the package substrate 110 can be electrically coupled to the package substrate 110, and the strain can thus be measured using corresponding conductive structures 115. In some embodiments, the strain can be measured across two conductive structures 115 instead of one conductive structure 115 and one bond pad 134. In some embodiments, the strain can be measured across two bond pads 134, each coupled to a TMV 132.

The strain gauges 140 can be fabricated by printing, photolithography, etching, or various other methods. In some embodiments, the strain gauges 140 can be fabricated and then positioned in the semiconductor device assembly 300, such as on the outer surface of the molding 130 or within the molding 130 through an opening. In some embodiments, the strain gauges 140 can be printed directly into place by an inkjet printing nozzle. The strain gauges 140 can be comprised of copper or other conducting material, such as iron or aluminum, and measure approximately 0.2 mm to 4.0 mm in size. The strain gauges 140 can be uniaxial or triaxial.

Figure 4:
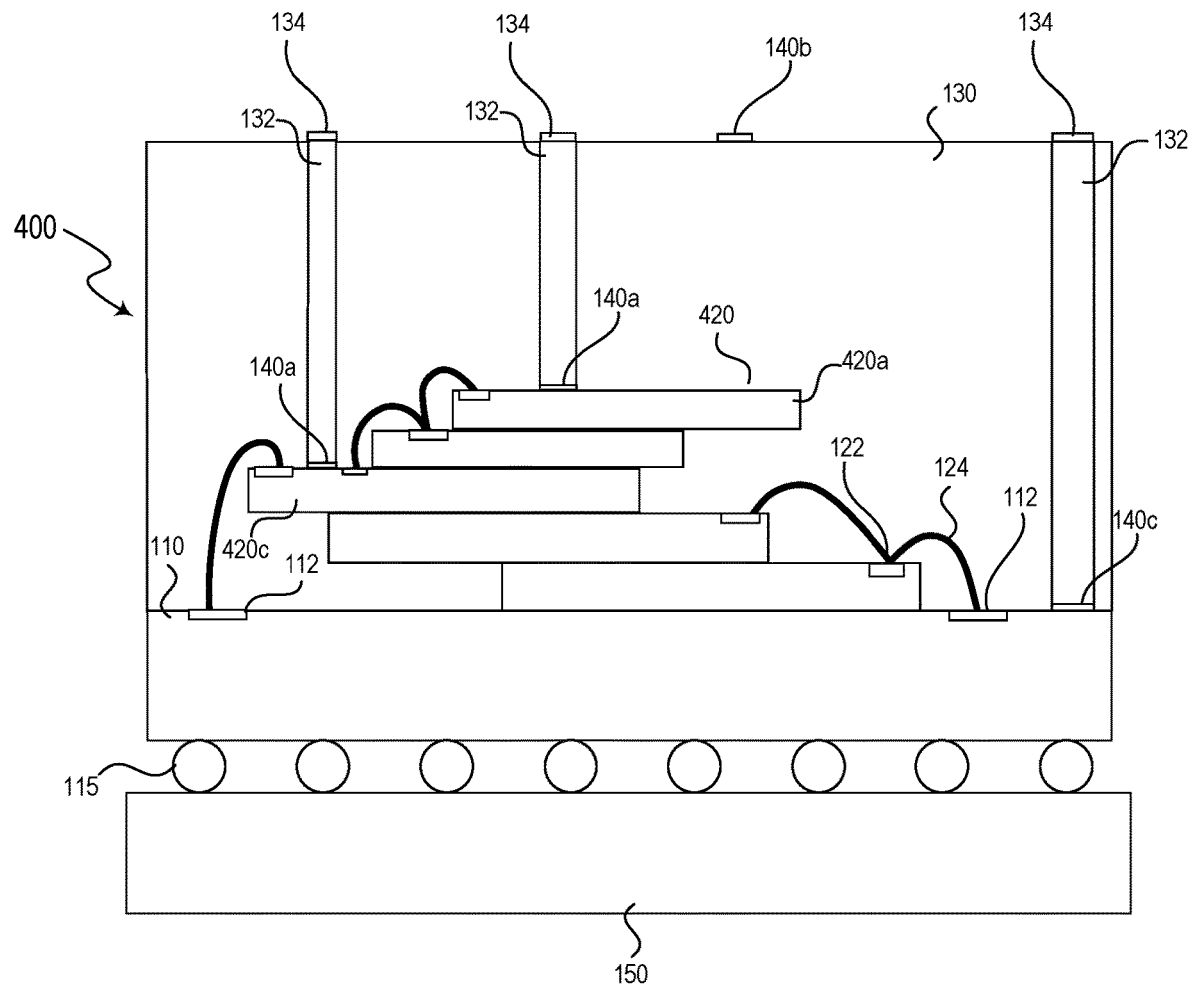
FIG. 4 is a cross-sectional view of a semiconductor device assembly with a stack of semiconductor dies in accordance with an embodiment of the present disclosure.

FIG. 4 is a cross-sectional view of a semiconductor device assembly 400 with a stack of semiconductor dies 420 in accordance with an embodiment of the present disclosure. The semiconductor device assembly 400 can be similar to the semiconductor device assemblies 100, 200, and 300 as shown in the previous figures. As shown, the semiconductor device assembly 400 can include a stack of semiconductor dies 420 with a different arrangement than semiconductor stack 320 of FIG. 3. As shown, the semiconductor stack 420 includes two sub-stacks of semiconductor dies. A first TMV 432a extends from the outer surface of the molding 130 to a surface of the top semiconductor die 420a, and a second TMV 432b extends from the outer surface of the molding 320 to a surface of the middle semiconductor die 420c. The semiconductor die stack 420 shown in FIG. 4 is electrically coupled via a plurality of bond wires 124 and bond pads 122, but other structures, such as through silicon vias (TSVs) can be used to electrically couple the dies of the stack 420.

Additionally or alternatively, the TMVs 432 can be formed to extend to surfaces of the other semiconductor dies of the stack 420, or to different positions on same dies. For example, the semiconductor device assembly 400 can include additional TMVs 132 that extend to the top semiconductor dies 420a with a corresponding strain gauge to measure strain across different points at the die 420a. In some embodiments, similar semiconductor device assemblies can be used to measure the strain for other arrangements of semiconductor dies. For example, a semiconductor device assembly can include more than one stack of dies, either with different stacking arrangements or the same stacking arrangement.

The semiconductor device assembly 400 can include one or more strain gauges, such as strain gauges 140a, 140b, and 140c (collectively, strain gauges 140). The strain gauges 140 can be similar to the strain gauges 140 of FIGS. 1-3. Strain gauges 140 can be embedded at various depths in the molding 130. For example, FIG. 4 shows two strain gauges 140a at surfaces of the semiconductor die stack 420—one on the first semiconductor die 420a and one on the third semiconductor die 420c. Also shown are a strain gauge 140b at the outer surface of the molding 130, and a strain gauge 140c at the surface of the package substrate 110. Note that the strain gauges 140 can have other positions and depths by varying their depths and locations in the molding 130, such as at surfaces of other components beneath the molding 130, or at an intermediate depth remote from the surface of any component. For example, it may be desired to measure strain at multiple positions on the outer surface of the molding 130, or to measure strain at multiple positions of the packaging substrate 110 using two strain gauges 140.

The strain gauges 140 can change resistance when a force is applied. Thus, a current measured across the strain gauge 140 can be correlated to the applied force. The current across a strain gauge 140 positioned on an outer surface of the molding, such as strain gauge 140c, can be directly measured by a suitable measurement device. A strain gauge 140 within the molding 130, such as strain gauges 140a and 140c, can be electrically coupled to one or more of the TMVs 132, and/or to one or more of the conductive structures 115. The semiconductor device assembly 100 can include bond pads 134 at the outer surface of the molding which are electrically coupled to the TMVs 132. Thus, a circuit incorporating the strain gauge 140a or 140c can run from the bond pad 134 at the outer surface of the molding 130, through the TMV 132 to the strain gauge 140a or 140c, and out through a conductive structure 115, such as a solder ball of a BGA, or back through a second TMV (not shown). For example, the strain gauges 140a at the surface of the semiconductor die 420a can be electrically coupled to the semiconductor die 420a, which can be electrically coupled to the package substrate 110 through bond pads 122, bond wires 124, and substrate pads 112. The package substrate 110 can include internal connections to conductive structures 115, which can then be used to measure current across strain gauges 140a. Similarly, strain gauge 140c positioned at the surface of the package substrate 110 can be electrically coupled to the package substrate 110, and the strain can thus be measured using corresponding conductive structures 115. In some embodiments, the strain can be measured across two conductive structures 115 instead of one conductive structure 115 and one bond pad 134. In some embodiments, the strain can be measured across two bond pads 134, each coupled to a TMV 132.

The strain gauges 140 can be fabricated by printing, photolithography, etching, or various other methods. In some embodiments, the strain gauges 140 can be fabricated and then positioned in the semiconductor device assembly 400, such as on the outer surface of the molding 130 or within the molding 130 through an opening. In some embodiments, the strain gauges 140 can be printed directly into place by an inkjet printing nozzle. The strain gauges 140 can be comprised of copper or other conducting material, such as iron or aluminum, and measure approximately 0.2 mm to 4.0 mm in size. The strain gauges 140 can be uniaxial or triaxial.

FIGS. 1-4 show stacking arrangements of semiconductor dies and die stacks and positions of TMVs and strain gauges in accordance with various embodiments of the present disclosure. However, as will be readily understood by those skilled in the relevant art, these are merely illustrative examples, and different stacking arrangements can result in different distributions of stress during dropping, bending, etc. In addition, different arrangements of other package structures, such as the distribution of conductive structures 115, can also affect how stress is distributed throughout a semiconductor device assembly. For example, an uneven distribution of conductive structures 115 can result in weak points, such as near the edge of the packaging. Therefore, in some embodiments, a strain gauge 140 can be positioned near a conductive structure 115 at the edge of the package. Generally, the strain gauges 140 can be positioned based on different aspects of the packaging structure, and embodiments of the present disclosure are not limited to the structures and strain gauge positions depicted in FIGS. 1-4. In addition, note that semiconductor device assemblies in accordance with various embodiments of the disclosure can be either mounted, e.g., to a PCB, or unmounted. Accordingly, for unmounted semiconductor device assemblies, the conductive structures 115 can comprise conductive pads without additional elements that facilitate mounting the assembly.

Figure 5A:
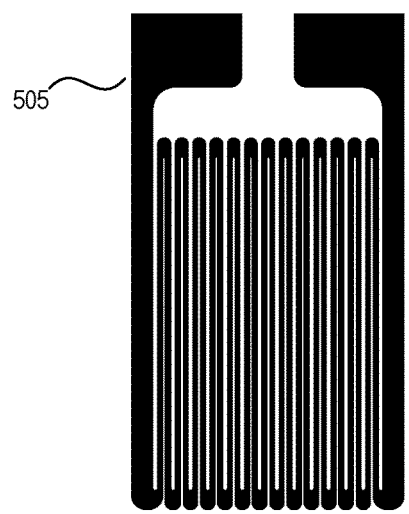
FIGS. 5A-C show example strain gauges in accordance with various embodiments of the present disclosure.
Figure 5B:
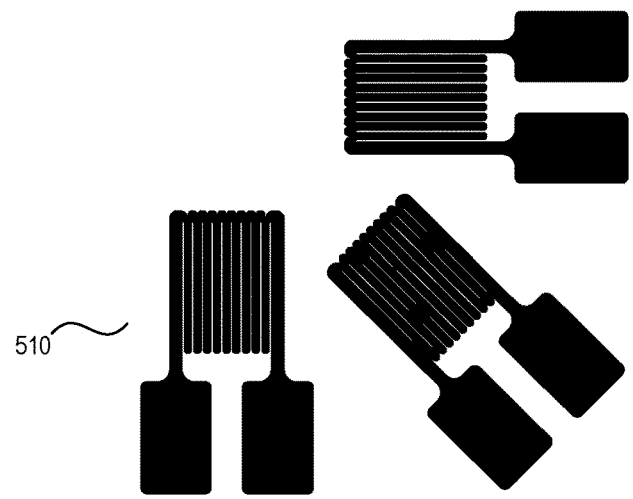
Figure 5C:
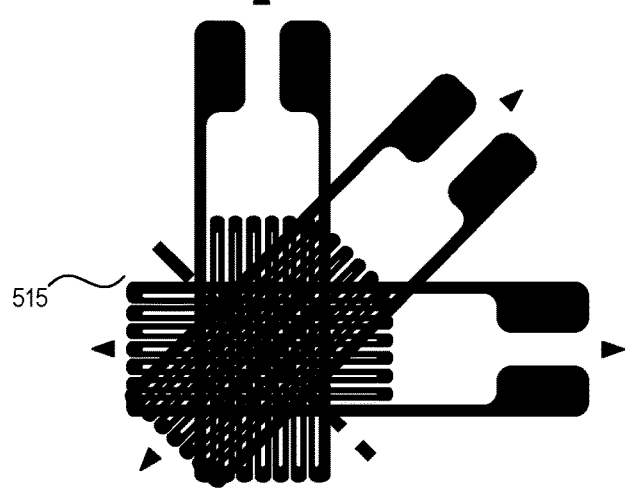

FIGS. 5A-C show example strain gauges 505, 510, and 515 in accordance with various embodiments of the present disclosure. FIG. 5A depicts an example uniaxial strain gauge 505, also referred to as an "axial" gauge. The uniaxial strain gauge 505 can be used to measure strain in one direction. As shown, the uniaxial strain gauge 505 can include a wire in a zig-zag pattern. Strain can cause the uniaxial strain gauge 505 to compress or stretch depending on the direction, changing the length of the wire and thus the resistance of the uniaxial strain gauge 515. Each of the strain gauges 505-515 can be about 0.2 to 4 mm in length or width. The strain gauges 505-515 can be printed using a nano-ink, such as a copper, iron, aluminum, or carbon-based conductive ink.

FIG. 5B shows an example tri-axial strain gauge 510, also referred to as a strain gauge "rosette." The tri-axial strain gauge 510 can include three uniaxial strain gauges oriented at an angle relative to each other. Each component strain gauge of tri-axial strain gauge 510 can be similar to the uniaxial strain gauge 505 and independently measure strain using separate circuits. For example, tri-axial strain gauge 510 as shown in FIG. 5B includes three strain gauges at 0-, 45-, and 90-degree angles, though other angles can be used. The tri-axial strain gauge 510 can give more complete strain information, such as allowing for calculation of normal, shear, and principal strains.

FIG. 5C shows another example of a tri-axial strain gauge 515. Similar to tri-axial strain gauge 510, tri-axial strain gauge 515 can include three separate strain gauges that independently measure strain in different directions but can have a more compact footprint. In addition, in accordance with other embodiments of the present disclosure, other configurations of strain gauges can be used for other purposes, such as to measure strain in a particular direction, or for different applications such as bending, twisting, etc.

FIGS. 5A-C show strain gauges in accordance with various embodiments of the present disclosure. However, as will be readily understood by those skilled in the relevant art, these are merely illustrative examples, and other strain gauges known in the art can also be used. For example, the strain gauges can measure strain along different numbers of axes or at different relative positions or angles. Various geometries can be used, such as double linear strain gauges, full bridge strain gauges, half bridge strain gauges, shear strain gauges, etc. In addition, other types of strain gauges besides the depicted foil gauges can be used, such as piezoresistive sensors.

Figure 6:
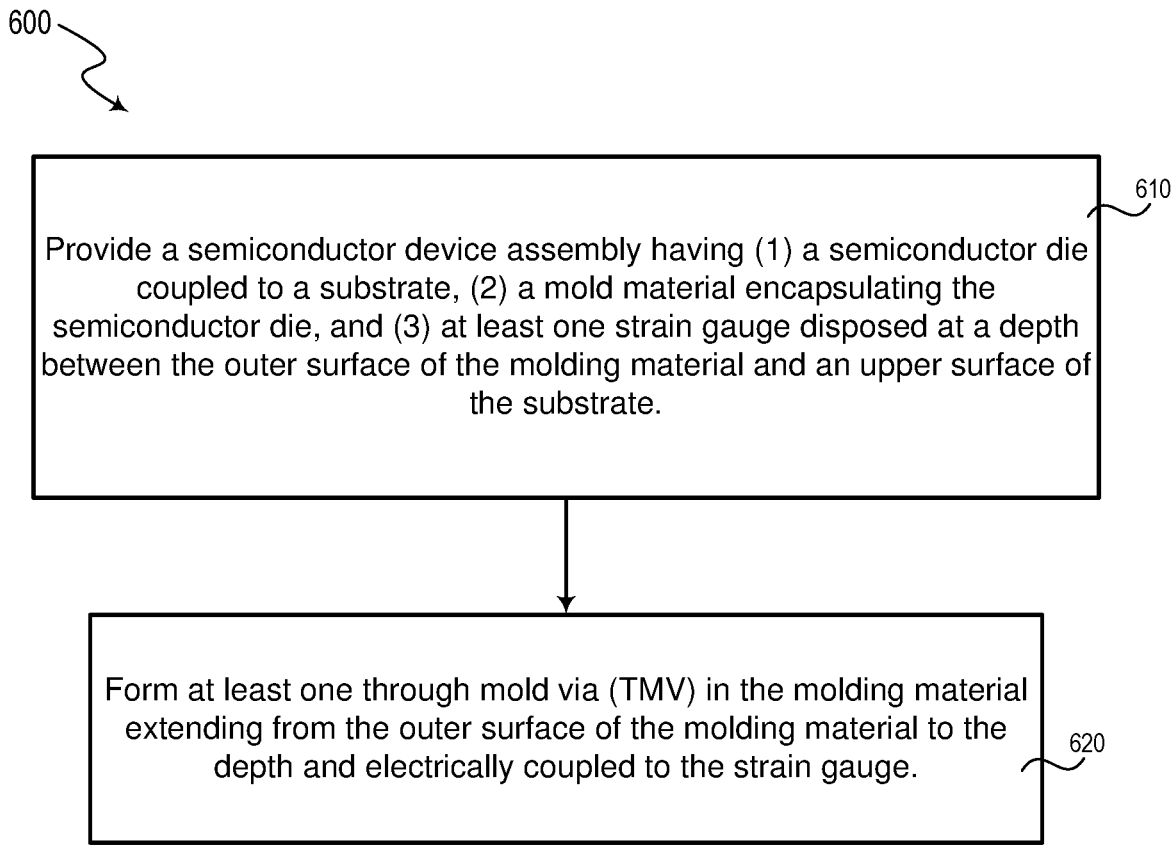
FIG. 6 is a flow chart illustrating a method of forming a semiconductor device assembly in accordance with an embodiment of the present disclosure.

FIG. 6 is a flow chart illustrating a method 600 of forming a semiconductor device assembly in accordance with an embodiment of the present disclosure. At 610, a semiconductor device assembly is provided, where the semiconductor device includes a semiconductor die coupled to a substrate, a mold material encapsulating the semiconductor die, and at least one strain gauge disposed between the outer surface of the molding material and an upper surface of the substrate. At 620, at least one through mold via (TMV) is formed in the molding material, the TMV extending from the outer surface of the molding material to the strain gauge and electrically coupled to the strain gauge.

In some embodiments, the strain gauge provided at 610 can be fabricated, such as by printing, and disposed in the semiconductor assembly, followed by encapsulation of the semiconductor die with the mold material. The TMV can then be formed at 620, such as by plating a formed opening with a conductor.

In some embodiments, the semiconductor die is first encapsulated with the mold material. An opening can then be formed in the mold material, through which the strain gauge can be printed or otherwise disposed. The TMV can then be formed in the opening at 620. For example, the TMV can be formed by disposing a preformed conductor in the opening followed by backfilling with a filler material. In another example, the TMV can be formed at 620 by filling the opening with a filler material, forming a smaller opening, and plating the smaller opening with a conductor.

Figure 7:
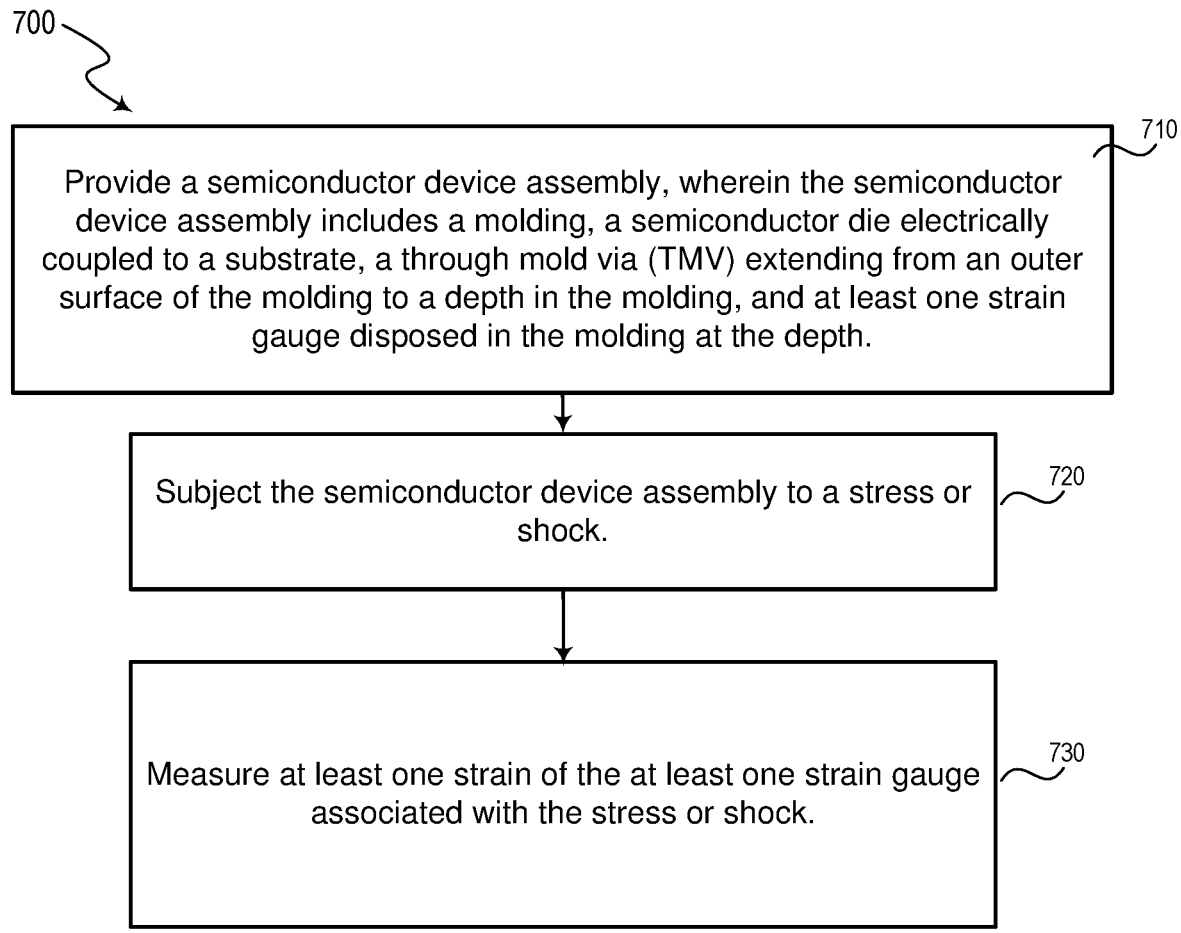
FIG. 7 is a flow chart illustrating a method of measuring strain of a semiconductor device assembly in accordance with an embodiment of the present disclosure.

FIG. 7 is a flow chart illustrating a method 700 of measuring strain of a semiconductor device assembly in accordance with an embodiment of the present disclosure. At 710, a semiconductor device assembly is provided, the semiconductor device including a molding, a semiconductor die electrically coupled to a substrate, a through mold via (TMV) extending from an outer surface of the molding to a depth in the molding, and at least one strain gauge disposed in the molding at the depth. At 720, the semiconductor device assembly is subjected to a stress or a shock. At 730, at least one strain associated with the stress or shock is measured using the at least one strain gauge.

In some embodiments, subjecting the semiconductor device assembly to a stress or shock at 720 can include dropping, throwing, or striking the semiconductor device assembly. A force can also be applied to the semiconductor device assembly to cause crushing or bending. The force can be applied to mimic conditions that are common for products using semiconductor devices. The strain gauge can be coupled to a measuring device prior to the stress or shock at 720.

In some embodiments, there can be a plurality of strain measurements simultaneously measured by a plurality of strain gauges at different positions in the semiconductor device assembly. For example, a first strain measurement can correspond to an outer surface of the molding and a second strain measurement can correspond to a surface of the semiconductor die. The relative strain between these two measurements can inform how well the semiconductor die is protected by the molding and other packaging components. The strain measurements can be measured over a duration of time corresponding to the stress or shock from 720 and analyzed to determine a maximum die strain over the duration. For example, the strain can be measured for approximately 5 ms. The duration can be adjusted as needed based on how the strain changes over time. In some embodiments, the measured strain can be compared to computer simulated strain calculations, such as by finite element methods.

Figure 8:
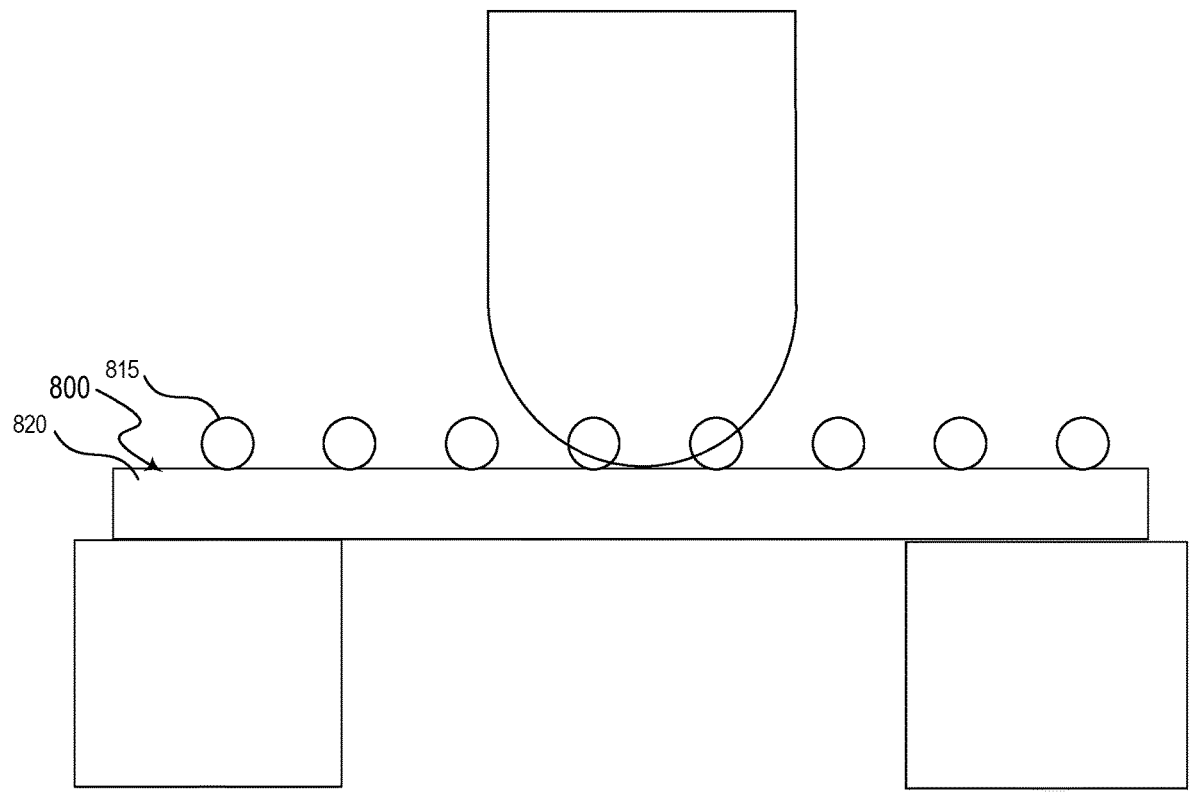
FIG. 8 is a simplified block diagram illustrating a semiconductor device assembly undergoing a three-point bend test in accordance with an embodiment of the present disclosure.

Strain measurements from 730 associated with the stress or shock can be compared to a result from a three-point bend test. For example, the semiconductor device assembly can undergo a three-point bend test as shown in FIG. 8 below. The strain resulting from the three-point bend can be denoted as $\varepsilon 0$, and strain that is measured as a result of the applied force from 720, such as a drop or bend, can be denoted as $\varepsilon 1$. Comparing the two values can then inform the risk of damage to the semiconductor device assembly in real-world usage and therefore inform further testing and quality control.

In some embodiments, the strain $\varepsilon 0$ from the three-point bend test is used to validate a strain measurement $\varepsilon 1$ by a strain gauge at the surface of the molding or the substrate. For example, if $\varepsilon 0 \gg \varepsilon 1$, this can indicate that the molding or substrate experiences relatively little strain when dropped or bent. If $\varepsilon 1 \gg \varepsilon 0$, this can indicate that the molding or substrate may be at a high risk of damage if used in a product like a phone that is often dropped.

Strain measurements from 730 associated with the stress or shock can be compared to a result from a four-point bend test. An example four-point bend test is described below in relation to FIG. 9. Similar to the three-point bend test, the strain resulting from the four-point bend test can be denoted as $\varepsilon 0$, and second strain that is measured as a result of the applied force from 720, such as a drop or bend, can be denoted as $\varepsilon 1$. The strain measured at 730 can vary with time as the semiconductor device assembly responds to the stress or shock experienced at 720. Thus, in some embodiments, a maximum measured strain value can be chosen for $\varepsilon 1$. Similarly, a maximum strain value measured during the three or four-point bend tests can be chosen for $\varepsilon 0$.

In some embodiments, the strain $\varepsilon 0$ from the four-point bend test is used to validate a strain measurement $\varepsilon 1$ by a strain gauge at the surface of the semiconductor die. For example, if $\varepsilon 0 \gg \varepsilon 1$, this can indicate that the semiconductor dies experiences little strain when dropped or bent. But if $\varepsilon 1 \gg \varepsilon 0$, then this can indicate that the semiconductor die may be at a high risk of damage. In some embodiments, the three-point bend test and the four-point bend test are both performed to validate strain measurements from a drop at both the package level and at the die level. In other embodiments, only one of the bend tests are performed, or none are performed. The bend tests can be performed prior to or after subjecting the semiconductor device assembly to the stress or shock at 720.

FIG. 8 is a simplified block diagram illustrating a semiconductor device assembly 800 undergoing a three-point bend test in accordance with an embodiment of the present disclosure. The semiconductor device assembly 800 can include conductive structures 815, die 820, and one or more strain gauges (not shown). The three-point bend test can be used to measure various components of semiconductor packaging, such as the strength of the die, the bond of the die and substrate, and ball grid arrays. For example, manufacturers of semiconductor devices can define a minimum strain for a device to be up to specifications, such as about 4000-8000$\mu\varepsilon$.

The three-point bend test can be used to evaluate the strength of semiconductor device assemblies according to various embodiments of the present disclosure. In some embodiments, the three-point bend test can be used to validate strain measurements from a drop or bend test. For example, the maximum strain measured from the three-point bend test can be compared to the strain measured by a strain gauge positioned on the outer surface of the molding.

Figure 9:
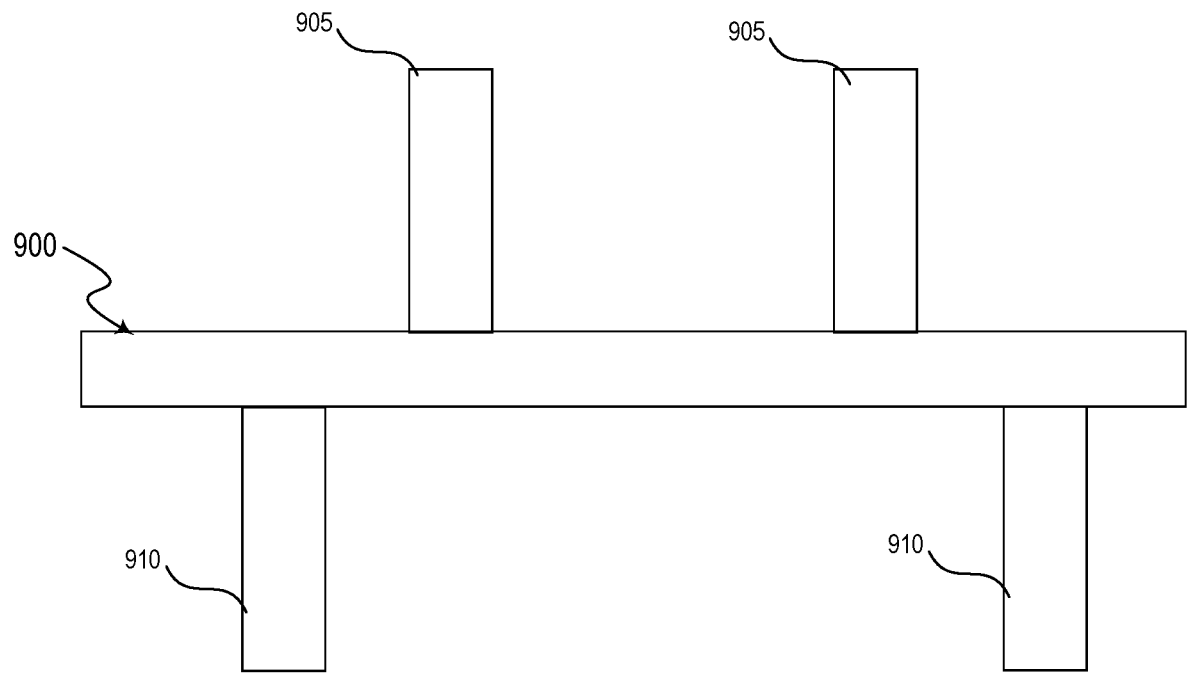
FIG. 9 is a simplified block diagram illustrating a semiconductor assembly undergoing a four-point bend test in accordance with an embodiment of the present disclosure.

FIG. 9 is a simplified block diagram illustrating a semiconductor assembly 900 undergoing a four-point bend test in accordance with an embodiment of the present disclosure. The distance between fixed anvils 910 is the support span of the four-point bend test, and the distance between the movable anvils 905 is the load span. Compared to the three-point bend test, such as in FIG. 8, a four-point bend test can distribute stress over a wider region based on the load span. The four-point bend test can be used to test the strength of a semiconductor device assembly. Like the three-point bend test shown in FIG. 8, the four-point bend test can be used to validate strain measurements from a bend or drop test. For example, the maximum strain measured from the four-point bend test can be compared to the strain measured by a strain gauge at a surface of semiconductor die or semiconductor stacks 120, 220, 320, or 420.

Figure 10:
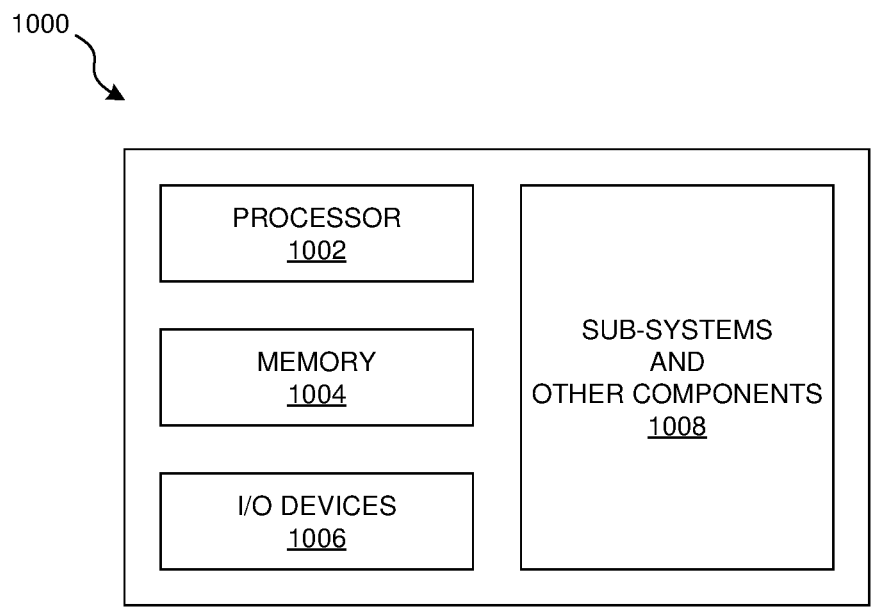
FIG. 10 is a schematic view of a system that includes a semiconductor device assembly configured in accordance with embodiments of the present technology.

Any one of the semiconductor devices and/or dies having the features described above with reference to FIGS. 1-9 can be incorporated into any of a myriad of larger and/or more complex systems, a representative example of which is system 1000 shown schematically in FIG. 10. The system 1000 can include a processor 1002, a memory 1004 (e.g., SRAM, DRAM, flash, and/or other memory devices), input/output devices 1006, and/or other subsystems or components 1008. The semiconductor dies and/or packages described above with reference to FIGS. 1-9 can be included in any of the elements shown in FIG. 10. The resulting system 1000 can be configured to perform any of a wide variety of suitable computing, processing, storage, sensing, imaging, and/or other functions. Accordingly, representative examples of the system 1000 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 1000 include lights, cameras, vehicles, etc. With regard to these and other examples, the system 1000 can be housed in a single unit or distributed over multiple interconnected units (e.g., through a communication network). The components of the system 1000 can accordingly include local and/or remote memory storage devices and any of a wide variety of suitable computer-readable media.

From the foregoing, it will be appreciated that specific embodiments of the invention have been described herein for purposes of illustration, but that various modifications may be made without deviating from the scope of the invention. Accordingly, the invention is not limited except as by the appended claims.

What is claimed:

1. A semiconductor device assembly comprising:
   a package substrate;
   a semiconductor die electrically coupled to the package substrate;
   a mold material covering at least a portion of the semiconductor die, the mold material including:
      a lower surface coupled to a surface of the semiconductor die,
      an upper surface, and
      a through-mold via (TMV) extending from the upper surface into the mold material at a depth;
   a solder ball attached to the package substrate;
   a pad coupled to the TMV on the upper surface of the mold material; and
   a strain gauge disposed at the depth between a bottom surface of the TMV and either the semiconductor die or the package substrate, the strain gauge being external to the semiconductor die and electrically coupled to the TMV, the solder ball, and the pad on the upper surface of the mold material.

2. The semiconductor device assembly of claim 1, wherein the TMV extends from the upper surface of the mold material to the surface of the semiconductor die, and wherein the strain gauge is coupled to the surface of the semiconductor die.

3. The semiconductor device assembly of claim 2, wherein the TMV is a first TMV and the strain gauge is a first strain gauge, and wherein the mold material includes a second TMV extending from the upper surface of the mold material to the surface of the semiconductor die, the semiconductor device assembly further comprising:
   a second strain gauge embedded in the second TMV and coupled to the surface of the semiconductor die at a different position from the first strain gauge.

4. The semiconductor device assembly of claim 2, wherein the TMV is a first TMV and the strain gauge is a first strain gauge, and wherein the semiconductor die is a first semiconductor die, the semiconductor device assemly further comprising:
   a second semiconductor die disposed above the first semiconductor die; and
   a second strain gauge,
   wherein the mold material includes a second TMV extending from the upper surface of the mold material to a surface of the second semiconductor die, and wherein the second strain gauge is embedded in the second TMV and coupled to the surface of the second semiconductor die.

5. The semiconductor device assembly of claim 1, wherein the TMV extends from the upper surface of the mold material to a surface of the package substrate, and wherein the strain gauge is coupled to the surface of the package substrate.

6. The semiconductor device assembly of claim 1, wherein the strain gauge is a first strain gauge, the semiconductor device assembly further comprising:
   a second strain gauge positioned on the upper surface of the mold material.

7. The semiconductor device assembly of claim 1, further comprising:
   a filling compound adjacent to the strain gauge, the filling compound having an average particle size less than 5 µm.

8. The semiconductor device assembly of claim 1, wherein the strain gauge is a uniaxial or triaxial strain gauge.

9. The semiconductor device assembly of claim 1, further comprising:
   a second TMV extending from the upper surface of the mold material, the second TMV electrically coupled to the strain gauge.

* * * * *